United States Patent [19]

Carinalli

[11] 4,291,319

[45] Sep. 22, 1981

[54] OPEN BASE BIPOLAR TRANSISTOR PROTECTIVE DEVICE

[75] Inventor: Charles P. Carinalli, Sunnyvale, Calif.

[73] Assignee: National Semiconductor Corporation, Santa Clara, Calif.

[21] Appl. No.: 52,531

[22] Filed: Jun. 27, 1979

Related U.S. Application Data

[63] Continuation of Ser. No. 687,722, May 19, 1976, abandoned.

[51] Int. Cl.[3] .............................................. H01L 29/90

[52] U.S. Cl. .......................................... 357/13; 357/36; 357/46; 307/250; 307/299 B; 307/303; 361/111; 307/542

[58] Field of Search ........................... 361/86, 91, 111; 357/36, 13, 48, 46; 307/299 B, 303, 250, 237

[56] References Cited

U.S. PATENT DOCUMENTS 3,435,295 3/1969 Ladd et al. .......................... 361/111

3,742,319 6/1973 Bryan et al. .......................... 357/36

3,821,780 6/1974 Harland et al. ........................ 357/36

OTHER PUBLICATIONS

W. Wu, "Resistor-Transistor Clamp," IBM Tech. Discl. Bull., vol. 10, #7, Dec. 1967, p. 1038.

Heathkit Assembly Manual for Oscilloscope IO-102, Heath Co., Benton Harbor, Mich., 1971, pp. 81, 89.

*Primary Examiner*—Joseph E. Clawson, Jr.

*Attorney, Agent, or Firm*—Gail W. Woodward; James A. Sheridan

[57] ABSTRACT

A transistor, used in the switching of current in an inductive load, is protected by a similar transistor connected between collector and base. The protective transistor has a lower breakdown voltage than the transistor being protected. When the inductive load produces a voltage surge, the protective transistor breaks down first and turns the protected transistor on so that the surge is absorbed in an active transistor not in breakdown and therefore capable of dissipating the surge without damage. Since the surge is arrested at high voltage the time required to complete the arrest is shortened.

5 Claims, 4 Drawing Figures

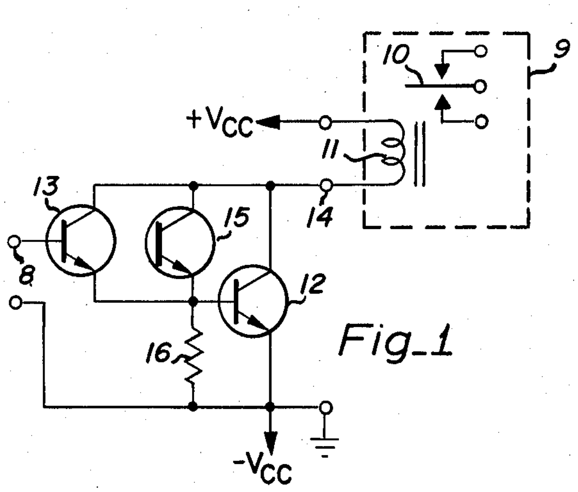
Fig_1
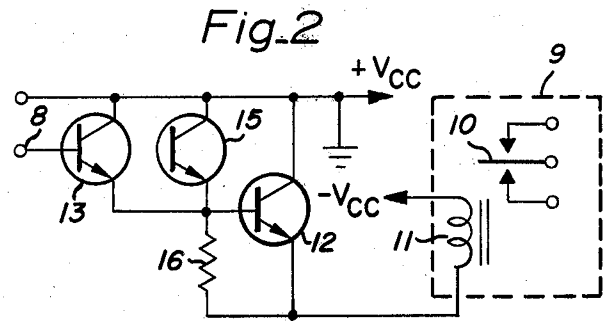
Fig_2
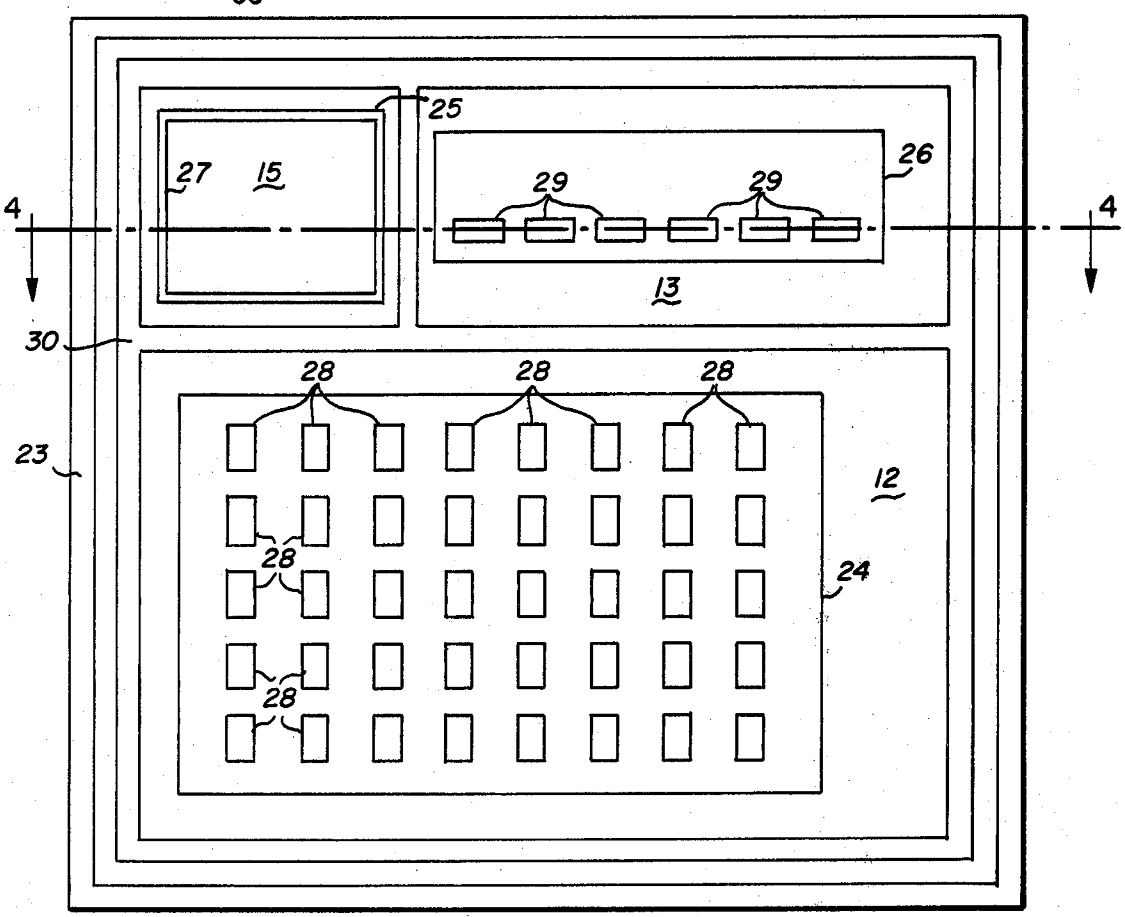
Fig_3
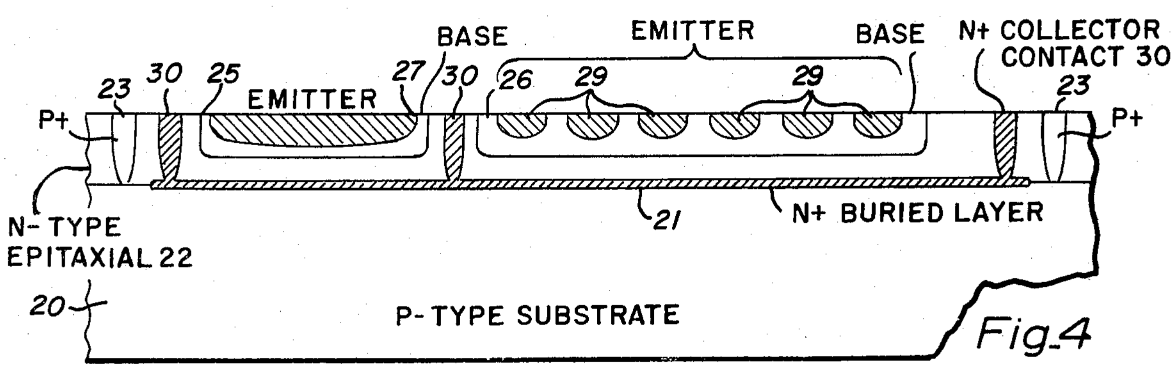
Fig_4

OPEN BASE BIPOLAR TRANSISTOR PROTECTIVE DEVICE

This is a continuation of application Ser. No. 687,722 filed on May 19, 1976, now abandoned.

BACKGROUND OF THE INVENTION

Transistors, when used to drive inductive loads in the switching mode, can be damaged by the voltage surge associated with the turn off operation. While the transistor could normally dissipate the energy involved, the breakdown mechanism tends to localize the action. This creates a hot spot in the transistor which in turn further localize the action and burn out occurs at the hot spot. In general when a voltage surge is applied to a transistor, electrical breakdown occurs at that point where the collector most closely approaches the emitter. The resultant current flow is localized and intense local heating at the point of breakdown further localizes the action. Thus a surge of relatively low energy can burn out a transistor of substantial power handling capability.

One approach to the problem has been to arrest the voltage surge in the inductive load with a separate device. For example a large capacitor can be connected across the load so that voltage surges are filtered. Alternatively a diode, poled to conduct during the surge, can act to short circuit the surge. Both of these approaches produce a very slow decay of surge energy and result in an often unacceptably long switching time.

A second approach is to connect a zener diode between the collector and base of the switching transistor. The zener voltage is selected to be as high as possible but lower than transistor breakdown voltage. Using this arrangement results in the voltage surge being arrested by the transistor but while it is active and thus capable of handling a large current distributed over its full area. The action also occurs at a relatively high voltage so that rapid decay of the surge can be achieved. However, it is difficult to match a zener diode with a transistor. The prior art practice has been to use a plurality of low voltage zener diodes in a stack with a single switching transistor. Typically the zener diodes are made using conventional transistor emitter-base structures. Thus the zener diodes are on the order of six volt units. To protect a 60-volt transistor a stack of nine such units would be series connected. Such an arrangement works well but the large number of diodes is cumbersome and expensive. Furthermore there is a problem in that the zener voltage does not track transistor breakdown in terms of the temperature of the switching transistor collector.

SUMMARY OF THE INVENTION

It is an object of the invention to use a protective transistor to prevent destruction of a switching transistor operating an inductive load device.

It is a further object of the invention to protect switching transistors of Darlington connection with a single transistor having a lower breakdown voltage when switching an inductive load.

It is a feature of the invention that a switching transistor can be protected from inductive surges using a single transistor in an arrangement that tracks in terms of temperature.

It is a further feature of the invention that a simple integrated circuit structure can contain both a switching transistor circuit and a protective device that allows safe rapid switching of inductive loads.

These and other features and objects are achieved in a simple transistor switch. A power transistor is common emitter connected to an inductive load either directly or in a Darlington configuration. A protective transistor is coupled between collector and base of the switching transistor. The protective transistor is of the same kind as the switching transistor and has a breakdown voltage somewhat lower than that of the switching transistor. When the switch is turned off an inductive surge raises the collector voltage toward breakdown level; the protective transistor will break down first and pull the switching transistor base voltage toward the collector voltage until the switching transistor is turned on. However, since the voltage is below switching transistor breakdown, the switch will be active and therefore able to dissipate large energy values thus arresting the surge. If the protective transistor is made like the switching transistor, but with a higher Beta, its breakdown will be slightly lower than the switching transistor breakdown and the characteristics will track. Furthermore if the combination is in the form of an IC, the characteristics will track even when the switching transistor becomes heated because of dissipation.

BRIEF DESCRIPTION OF THE DRAWING

FIG. 1 is is a schematic diagram of the circuit of the invention;

FIG. 2 is a schematic diagram of the invention showing an alternative power supply connection;

FIG. 3 is an integrated circuit form of the invention showing topography; and FIG. 4 is a cross section of the showing of FIG. 3 taken at line 4—4.

DESCRIPTION OF THE INVENTION

FIG. 1 shows a schematic diagram of a relay driver circuit. An electromagnetic relay 9 is shown inside the dashed outline. It comprises a coil 11 and a set of mechanical contacts 10 which perform the ultimate desired switching function. Since the relay is electromechanical and a substantial mechanical force involved, the coil energy requirement is substantial. Accordingly it is often desirable to supply the energy by way of a transistor amplifier. In this way a relatively small toggle current at terminal 8 can suffice for reliable relay operation.

While not shown, suitable conventional circuitry will be connected to terminal 8. This can be in the form of switching elements and can if desired be conventional digital logic circuit devices.

In FIG. 1 transistors 12 and 13 are Darlington connected to drive relay coil 11 in a common-emitter circuit. Typically the supply voltage, $V_{CC}$ will be slightly greater than the voltage required by coil 11. In the off state, transistor 12 must support the full $V_{CC}$ and collectoremitter voltage breakdown must exceed $V_{CC}$ by a safe factor. For example in a circuit rated at 50 volts an output device rated at 56 volts minimum could be used.

In typical prior art circuits a diode or large capacitor would ordinarily be connected across coil 11 to protect transistor 12 from damaging circuit transients. When relay 9 is energized a substantial current flows. When this current is interrupted, as by turning transistor 12 off, the inductive action of coil 11 can generate a voltage spike that can easily damage the transistor. If a diode is connected across coil 11 and poled to conduct, on the voltage spike, the spike will be arrested. A large value shunt capacitor will also arrest the spike. However either the diode or capacitor can prolong the relay drop-out time excessively and at best add an external circuit component. One prior art solution to the problem has been to connect a zener diode between collector and base of transistor 12. The zener breakdown is chosen to be slightly below the collector emitter breakdown of transistor 12 yet greater than the desired operating voltage. Thus when the inductive spike rises above the zener breakdown, transistor 12 is turned on briefly so as to absorb the spike energy but in an active mode rather than in breakdown. This action can rapidly absorb the spike and yet protect the transistor. However the problem of matching a zener diode to the transistor is difficult. The resolution to this matching problem has been to use a series array of zener diodes made from diffused transistor base emitters. These diodes break down at about 6 volts so that in a transistor having a 60 volt breakdown, 9 such 6-volt diodes would produce a 54-volt rated circuit. However the nine series connected diodes also presents a fabrication problem.

As shown in the circuit of FIG. 1 a protective transistor 15 is connected between base and collector of transistor 12. In 15 only the emitter and collector are connected, the base being left open. Transistor 15 is selected to be a match for transistor 12 except for having a slightly greater current amplification between base and collector, or Beta. This means that transistor 15 will have a breakdown voltage that is slightly lower than that of transistor 12. Thus transistor 15 acts like a zener diode having a breakdown slightly lower than that of transistor 12 thereby providing the desired protection.

Furthermore if transistor 13 is of the same construction as transistor 12 except for having a smaller area, transistor 15 will protect transistors 13 and 12 from damage from voltage spikes at terminal 14 caused by the inductive load.

Resistor 15 is present in the circuit to control operating bias. When transistors 13 and 15 are in a low conduction state resistors 15 ensures that transistor 12 will be turned off.

FIG. 2 shows a circuit that functions as does the circuit of FIG. 1. However, instead of connecting the relay coil to the collector of transistor 12, the relay coil 10 is connected between the emitter of transistor 12 and the negative power supply terminal $-V_{CC}$. The positive or grounded terminal $+V_{CC}$ is connected to the collector of transistor 12. The circuit operating characteristics of FIGS. 1 and 2 are identical and both versions are shown to indicate that only the series relationship between the relay coil 10 and the power supply are critical.

While the schematics of FIGS. 1 and 2 show a ground terminal, this is done for the convenience of the circuitry (not shown) that drives terminal 8. As a practical matter as long as suitable drive circuitry is used and conventionally connected, the ground could be omitted entirely or it could be place at any desired circuit node.

While the circuit of FIGS. 1 and 2 can be realized using discrete components the advantages can best be realized in integrated circuit (IC) form.

FIG. 3 shows a three element composite transistor structure using the invention. FIG. 4 is a sectional view of the upper portion designated as the line 4—4 in FIG. 3. These two figures should be considered together in the following description.

In the IC process, the starting material is a wafer 20 of p-type silicon. A heavily doped N-type buried layer 21 is established in the conventional manner to lie under the device trio to be described. A common buried layer is feasible because all three collectors are common. The wafer, with its buried layer inserts, is over coated with an epitaxial layer 22 of N-type silicon having a resistivity suitable for transistor collectors.

An isolation ring 23 of heavily doped p-type material extends completely through the epitaxial layer and is designed to isolate the common transistors as a unit. Collector contact diffusion 30 is of heavy N-type doping that extends through epitaxial layer 22 to contact buried layer 21. As can be seen from FIG. 3, this diffusion creates three separate transistor areas.

It is to be understood that the drawing is not to scale, but is expanded where appropriate to better show structural details. Also while only the region of transistors 12, 13, and 15 of FIG. 1 is illustrated, other associated IC devices may be fabricated into the silicon material to form a complete functional circuit. The oxide film, used in the planar device fabrication process, and the overlying metalization layer have been omitted to show the topographical details. Since the planar process is well known, the process details will be omitted in the following description.

Transistor base diffusions are shown at 24, 25, and 26. FIG. 3 shows where the junctions produced by the diffusions intersect the surface and FIG. 4 shows the cross section of diffusions 25 and 26. A transistor emitter diffusion produces the junction at 27 and is heavily doped N-type. This diffusion almost fills base diffusion 25. This can be done because transistor 15 needs no base contact. The emitter of transistor 12 is actually a series of separate emitters 28 of small area that will ultimately be parallel connected and are located inside base diffusion 24. The emitter of transistor 13 is also composed of separate emitters 29 of small area inside base diffusion 26. Emitters 29 will ultimately be connected in parallel and to the base region 24 of transistor 12. It will be noted that the drawing shows six emitters in transistors 13 and forty emitters in transistors 12. Since the individual emitters of transistors 12 and 13 are the same size these devices will have the same characteristics except for total collector current rating. However, transistor 15 has a much larger emitter diffusion area 27. In the planar process, in terms of impurity penetration, a large area diffusion will penetrate more at the center than will the centers of the smaller areas. This means that diffusion 27 will tend to approach the base diffusion depths more clearly than will diffusions 29 or 28. Accordingly transistor 15 will have a greater Beta and a collector-to-emitter voltage breakdown correspondingly lower then the breakdown voltages of transistors 12 and 13 which, due to similar emitter geometries, will be substantially the same. It has been found that circuits can be manufactured where transistors 15 will have a breakdown of 65 volts whereas transistors 12 and 13 break down at 75 volts. Clearly whatever the voltage breakdown for transistors 12 and 13, transistor 15 will be lower by virtue of physical design and the fact that all three devices are fabricated simultaneously in adjacent silicon areas. Thus the desired characteristics are self tracking because of the process. Also, because of the proximity, any thermal effects will tend to act equally on all three devices which will therefore tend to track.

Diffusion 30 represents a collector contact diffusion. This provides an ohmic low resistance connection via buried layer 21 to the collector regions of all three transistors. Since the collectors are all connected together, region 30 is a single continuous diffusion region surrounding the three transistors.

While not shown, the silicon surface is coated with the conventional planar oxide and a metalization layer that makes contact through holes etched in the oxide to the diffused emitter base and collector electrodes. The metal is contoured so that emitters 28 are parallel connected by means of a series of eight fingers. Base metal contact fingers interdigitate the emitter metal contacts and connect to parallel connected emitters 29 as well as to emitter 27. A metal base finger paralleling emitters 29 would comprise the circuit input terminal 8.

Resistor 15 could be in the form of the resistive metalization or, in planar diffused form, in the silicon substrate outside of isolation ring 23.

The invention has been described as an electronic circuit and its preferred IC form detailed. Clearly there are equivalents and modifications that will occur to a person skilled in the art. For example, while a version using NPN transistors has been shown, PNP structures could be used, along with reversed power supply connections. Furthermore while a Darlington structure is shown, the protective transistor could be used with a single power output transistor. While FIGS. 3 and 4 show the preferred embodiment, wherein a single isolation region contains the active transistors, each transistor could be separately fabricated inside a p-type isolation diffusion and then interconected as desired solely by metalization. Finally, other drive circuitry could be used. Accordingly it is intended that the invention be limited only by the following claims.

I claim:

1. An integrated circuit for switching inductive load devices which generate transient voltages that may rise to levels in excess of transistor collector breakdown, said integrated including means for arresting said transient voltages to limit them to levels below said transistor collector breakdown and comprising:

a semiconductor substrate;

at least one isolated region in said substrate;

an output transistor located in said isolated region, said output transistor having a base, a collector and an emitter made up of a plurality of individual small area emitter sections, the combination of which provides the total collector current capability, and a protective active transistor located in said substrate, said protective transistor having a floating, unconnected base, a collector coupled in common with said collector of said output transistor, and an emitter coupled to said base of said output transistor whereby said collector of said protective transistor in reverse biased when acting as a protective device, said emitter of said protective transistor being composed solely of a single emitter section having an area that is large in relation to the area of an individual one of said small area emitter sections to create a base region in said protective transistor that is thinner than the base region in said output transistor, said protective transistor having an active and higher base to collector current gain and a collector breakdown voltage that is close to but lower than the collector breakdown voltage of said output transistor.

2. The integrated circuit of claim 1 wherein said output transistor and said protective transistor are located in common in said isolated region whereby said output and protective transistors have common collectors.

3. The integrated circuit of claim 2 wherein said isolated region further includes a driver transistor having a collector in common with the collectors of said output and said protective transistors, a base coupled to an input terminal, and an emitter coupled to the base of said output transistor, said emitter of said driver transistor being comprised of a plurality of individual small area sections of the same character as those of said output transistor emitter, the number of sections in said drive transistor being fewer than the number in said output transistor whereby said driver transistor has a breakdown voltage equal to that of said output transistor and said protective transistor acts to protect both said output transistor and said driver transistor.

4. The integrated circuit of claim 3 wherein said isolated region comprises an epitaxial layer of one conductivity type on a substrate having the opposite conductivity type and said isolated region is achieved by a diffused region having a conductivity of the same type as that of said substrate.

5. The integrated circuit of claim 4 wherein a buried layer of high conductivity is located at the juncture of said epitaxial layer and said substrate inside said isolated region.

* * * * *